(12) United States Patent
Wu et al.

(10) Patent No.: US 11,145,650 B2
(45) Date of Patent: Oct. 12, 2021

(54) GATE CUT DIELECTRIC FEATURE AND METHOD OF FORMING THE SAME

(71) Applicant: Taiwan Semiconductor Manufacturing Co., Ltd., Hsinchu (TW)

(72) Inventors: Xusheng Wu, Hsinchu (TW); Chang-Miao Liu, Hsinchu (TW); Huiling Shang, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/656,609

(22) Filed: Oct. 18, 2019

(65) Prior Publication Data
US 2021/0118875 A1  Apr. 22, 2021

(51) Int. Cl.
*H01L 27/088* (2006.01)
*H01L 21/8234* (2006.01)
*H01L 21/02* (2006.01)

(52) U.S. Cl.
CPC ...... *H01L 27/0886* (2013.01); *H01L 21/0217* (2013.01); *H01L 21/0228* (2013.01); *H01L 21/02211* (2013.01); *H01L 21/02238* (2013.01); *H01L 21/02282* (2013.01); *H01L 21/823437* (2013.01)

(58) Field of Classification Search
CPC ............. H01L 27/0886; H01L 21/0217; H01L 21/02211; H01L 21/02238; H01L 21/0228
See application file for complete search history.

(56) References Cited

U.S. PATENT DOCUMENTS

| 8,796,666 | B1 | 8/2014 | Huang et al. |
| 8,815,712 | B2 | 8/2014 | Wan et al. |
| 8,963,258 | B2 | 2/2015 | Yu et al. |
| 9,093,530 | B2 | 7/2015 | Huang et al. |
| 9,171,929 | B2 | 10/2015 | Lee et al. |
| 9,214,555 | B2 | 12/2015 | Oxland et al. |
| 9,236,267 | B2 | 1/2016 | De et al. |
| 9,520,482 | B1 | 12/2016 | Chang et al. |
| 9,548,303 | B2 | 1/2017 | Lee et al. |
| 9,576,814 | B2 | 2/2017 | Wu et al. |

(Continued)

OTHER PUBLICATIONS

Lin, Ta-Chun et al., "Gate Structure and Method," U.S. Appl. No. 16/397,248, filed Apr. 29, 2019, 42 pages.

*Primary Examiner* — Marc Anthony Armand
(74) *Attorney, Agent, or Firm* — Haynes and Boone, LLP

(57) ABSTRACT

Integrated circuit devices and methods of forming the same are provided. An integrated circuit device in an embodiment includes a first multi-gate active region over a substrate, a second multi-gate active region over the substrate, a first gate structure over the first multi-gate active region, a second gate structure over the second multi-gate active region, and a dielectric feature disposed between the first gate structure and the second gate structure. The dielectric feature includes an oxygen-free layer in contact with the first gate structure and the second gate structure, a silicon oxide layer over the oxygen-free layer, and a transition layer disposed between the oxygen-free layer and the silicon oxide layer. An oxygen content of the transition layer is smaller than an oxygen content of the silicon oxide layer.

20 Claims, 11 Drawing Sheets

(56) References Cited

U.S. PATENT DOCUMENTS

| | | | | |
|---|---|---|---|---|
| 9,972,495 B1* | 5/2018 | Wu | ................... | H01L 29/66545 |
| 10,083,874 B1* | 9/2018 | Yu | ................... | H01L 21/823431 |
| 2019/0341475 A1* | 11/2019 | Shu | ................... | H01L 29/66545 |

* cited by examiner

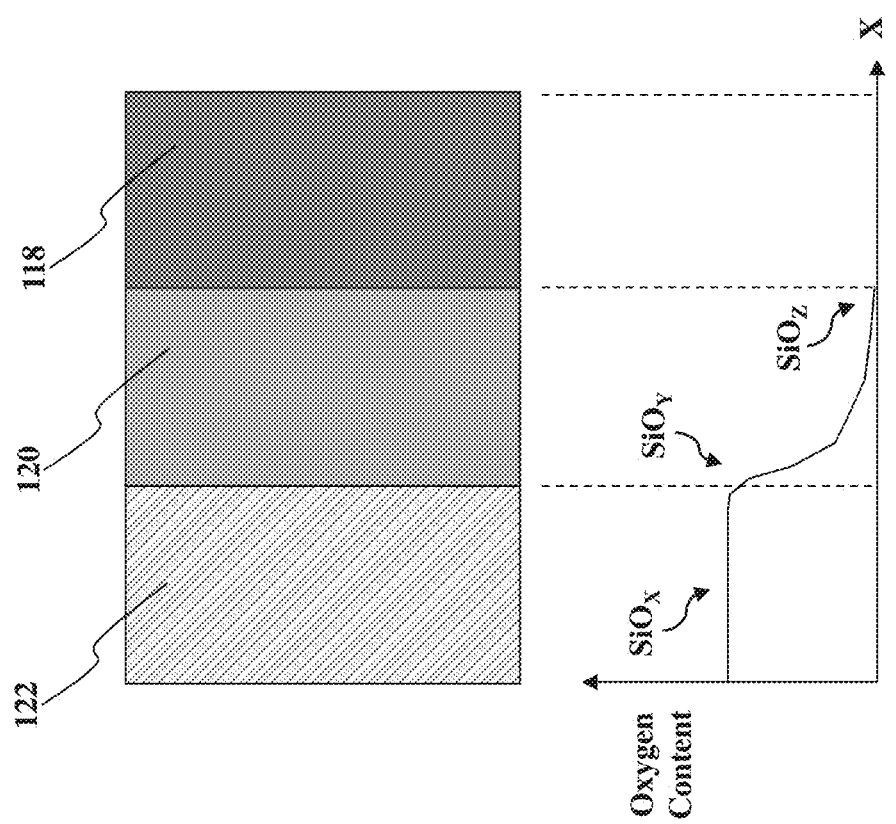

GATE CUT DIELECTRIC FEATURE AND METHOD OF FORMING THE SAME

BACKGROUND

The integrated circuit (IC) industry has experienced exponential growth. Technological advances in IC materials and design have produced generations of ICs, where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, conventional gate cutting techniques are significantly constrained by the dense packing of IC features required for advanced IC technology nodes. In particular, gate cutting techniques typically implement etching processes that form a gate cut opening in a gate stack (including, for example, at least one gate electrode layer and at least one gate dielectric layer) and then filling the gate cut opening with a refill dielectric material. Conventionally, to prevent threshold voltage shift due to oxygen diffusion, the refill dielectric material to be filled in the gate cut opening includes those with high dielectric constant, resulting in high parasitic capacitance and compromised performance. Accordingly, although existing gate cutting techniques and resulting gate structures have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 11 is an oxygen content distribution across layers of material filled in a gate cut opening, according to various aspects of the present disclosure.

DETAILED DESCRIPTION

Figure 1:
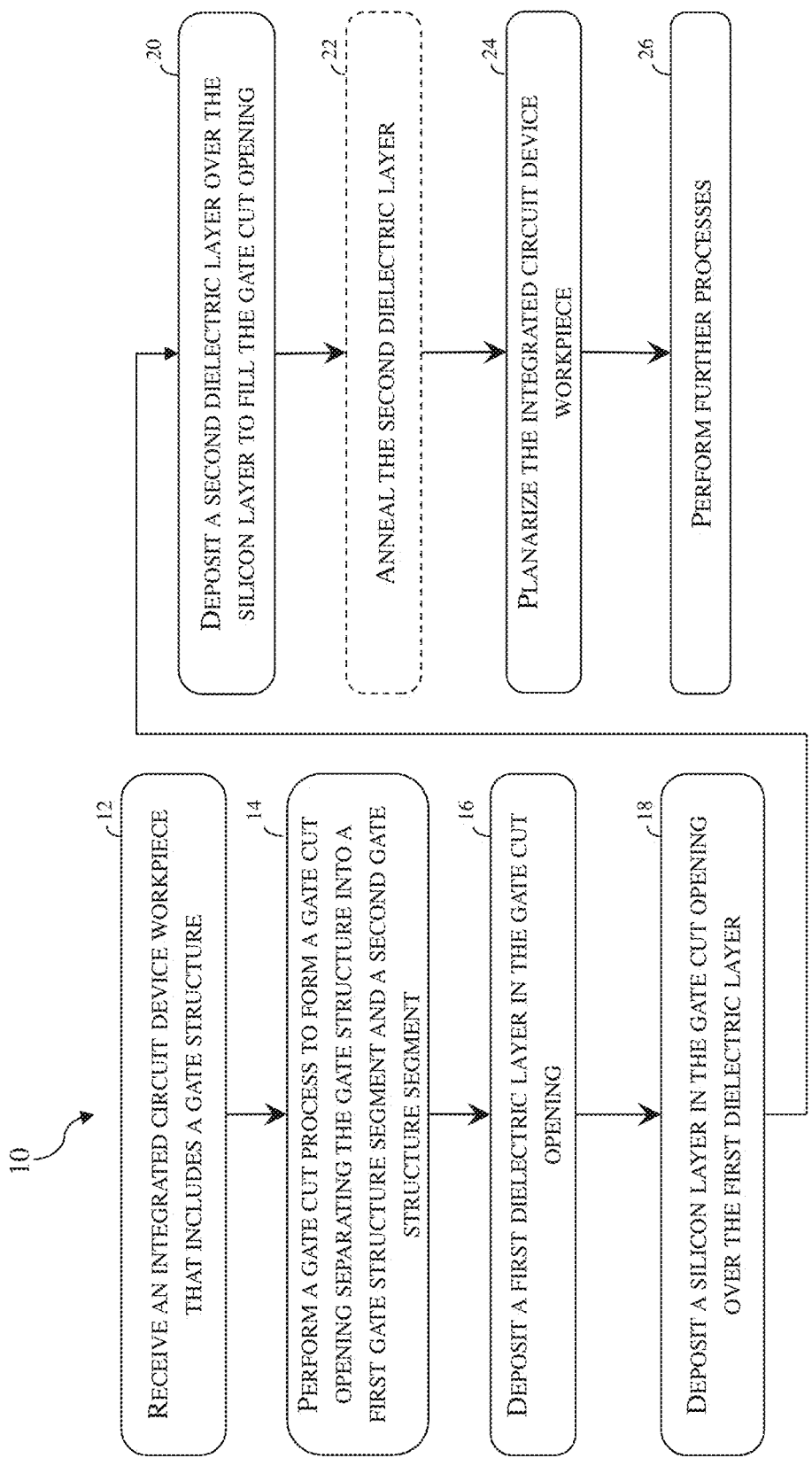
FIG. 1 is a flow chart of a method for fabricating an integrated circuit device according to various aspects of the present disclosure.

The present disclosure relates generally to integrated circuit devices, and more particularly, to gate cutting techniques for integrated circuit devices.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

When gate cutting techniques are applied to metal gate structures that include metal fill layers, various work function layers, gate dielectric layers, and interfacial layers, the gate cut process may be referred to a cut metal gate process. In a conventional cut metal gate process, a gate cut dielectric feature formed in a gate cut opening to separate a metal gate structure may be formed by filling into the gate cut opening silicon nitride to prevent oxygen atoms in the refill dielectric material. Depending on the process conditions, silicon nitride has a dielectric constant ranging from about 5 to about 10. Under common process conditions, the dielectric constant of silicon nitride is about 7.5. In addition, voids or porosity may be introduced into silicon oxide to further reduce the dielectric constant to near 3. As compared to gate cut dielectric feature formed of silicon oxide, silicon nitride gate cut dielectric feature in the conventional cut metal gate process may result in 2% to 20% increase in gate-to-gate capacitance. Such increase in gate-to-gate parasitic capacitance may translate into reduced speed when indexed using a ring oscillator.

While forming gate cut dielectric features using silicon oxide alone may reduce gate-to-gate parasitic capacitance, it can create other challenges. It has been observed that when put in direct contact with metal gate structures, oxygen atom from silicon oxide may diffuse into various metal layers, such as work function layers, during subsequent annealing processes.

The present disclosure provides a multi-layer gate cut dielectric feature for dividing a metal gate structure into separate gate structure segments and methods of forming the multi-layer gate cut dielectric feature. The multi-layer gate cut dielectric feature according to embodiments of the present disclosure includes a silicon nitride layer over sidewalls of the gate cut opening, a silicon transition layer over the silicon nitride layer, and a silicon oxide layer over the silicon transition layer. The silicon nitride layer serves as an oxygen blocking layer to block oxygen diffusion while the transition layer serves as an oxygen trap to trap oxygen atoms. The transition layer may be formed by depositing a silicon layer over the silicon nitride layer using atomic layer deposition (ALD), chemical vapor deposition (CVD), plasma-enhanced chemical vapor deposition (PECVD), or epitaxial growth. After the silicon oxide layer is deposited over the silicon layer, the silicon oxide layer may be annealed in a stand-alone anneal process or in a subsequent anneal process. The gate cut dielectric feature of the present disclosure includes silicon oxide to reduce gate-to-gate capacitance and the silicon nitride layer and the transition layer together prevent oxygen diffusion from the silicon oxide layer into gate structure segments.

FIG. 1 illustrates a flow chart of a method 10 for fabricating an integrated circuit device according to various aspects of the present disclosure. FIG. 1 will be described below in conjunction with FIGS. 2-10, which are fragmentary top or cross-sectional views of an integrated circuit device workpiece 100 at various stages of fabrication according to method 10 in FIG. 1. Throughout the present disclosure, for the ease of reference, the integrated circuit device workpiece 100 (or workpiece) and the integrated circuit device to be formed from the integrated circuit device workpiece 100 may be referred to interchangeably. For that reason, they may share the same reference numeral. Additional steps can be provided before, during, and after method 10, and some of the steps described can be moved, replaced, or eliminated for additional embodiments of method 10.

Integrated circuit device 100 may be included in a microprocessor, a memory, and/or other integrated circuit device. In some implementations, integrated circuit device 100 may be a portion of an IC chip, a system on chip (SoC), or portion thereof, that includes various passive and active microelectronic devices such as resistors, capacitors, inductors, diodes, p-type FETs (PFETs), n-type FETs (NFETs), metal-oxide-semiconductor FETs (MOSFETs), complementary MOS (CMOS) transistors, bipolar junction transistors (BJTs), laterally diffused MOS (LDMOS) transistors, high voltage transistors, high frequency transistors, other suitable components, or combinations thereof. The various transistors may be planar transistors or multi-gate transistors, such as fin-type FETs (FinFETs) or gate-all-around (GAA) transistors, depending on design requirements of integrated circuit device 100. FIGS. 2-10 have been simplified for the sake of clarity to better understand the inventive concepts of the present disclosure. Additional features can be added in integrated circuit device 100, and some of the features described below can be replaced, modified, or eliminated in other embodiments of integrated circuit device 100.

Figure 2:
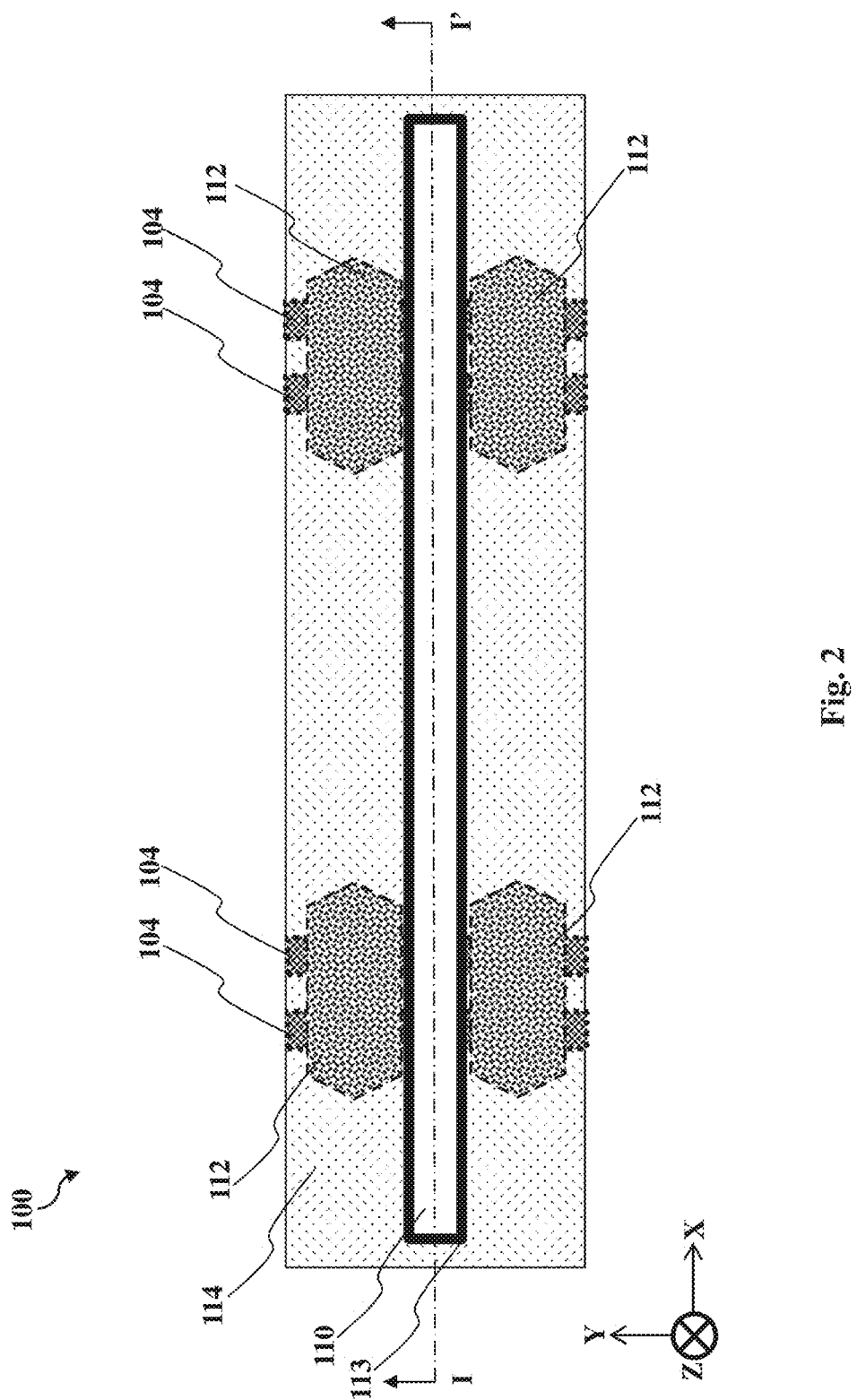
FIGS. 2-10 are fragmentary diagrammatic views of an integrated circuit device, in portion or entirety, at various fabrication stages (such as those associated with the method in FIG. 1) according to various aspects of the present disclosure.
Figure 3:
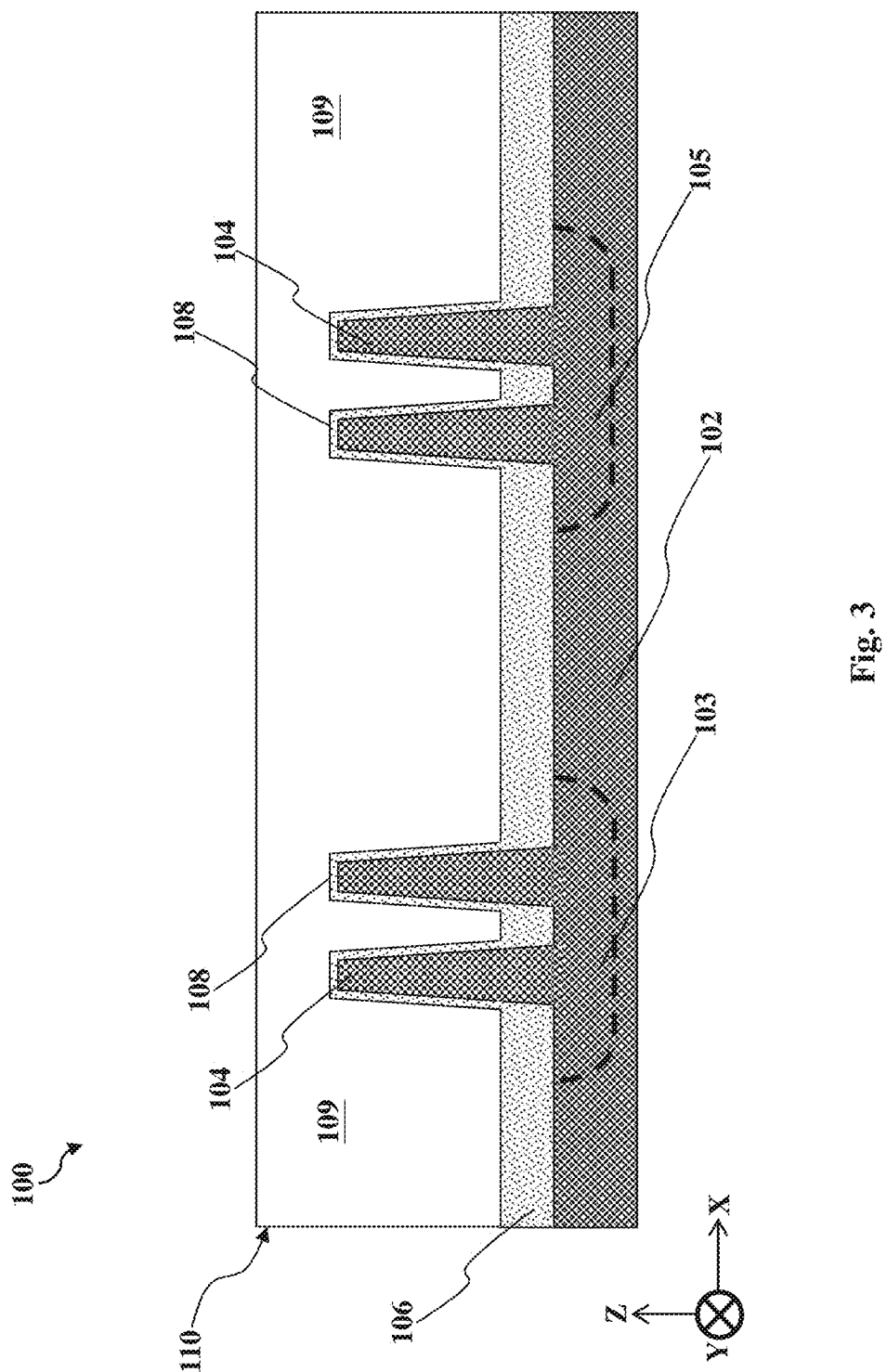

Referring to FIGS. 1, 2 and 3, method 10 includes a block 12 where an integrated circuit device workpiece 100 (or workpiece 100, or integrated circuit device 100) is received and the integrated circuit device workpiece 100 includes a gate structure 110. FIG. 2 is a fragmentary top view of the integrated circuit device 100 and FIG. 3 is a fragmentary cross-sectional view of the integrated circuit device 100 along cross section I-I' in FIG. 2. Integrated circuit device 100 includes a substrate (wafer) 102. In the depicted embodiment, substrate 102 is a semiconductor substrate, including, for example, silicon. Alternatively or additionally, substrate 102 includes another elementary semiconductor, such as germanium; a compound semiconductor, such as silicon carbide, gallium arsenide, gallium phosphide, indium phosphide, indium arsenide, and/or indium antimonide; an alloy semiconductor, such as SiGe, GaAsP, AlInAs, AlGaAs, GaInAs, GaInP, and/or GaInAsP; or combinations thereof. Alternatively, substrate 102 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods. In some implementations, substrate 102 includes one or more group III-V materials and/or one or more group II-IV materials.

Substrate 102 may include various doped regions, such as a doped region 103 and a doped region 105, configured according to design requirements of integrated circuit device 100. In some implementations, substrate 102 includes p-type doped regions (for example, p-type wells) doped with p-type dopants, such as boron (for example, $BF_2$), indium, other p-type dopant, or combinations thereof. In some implementations, substrate 102 includes n-type doped regions (for example, n-type wells) doped with n-type dopants, such as phosphorus, arsenic, other n-type dopant, or combinations thereof. In some implementations, substrate 102 includes doped regions formed with a combination of p-type dopants and n-type dopants. In the depicted embodiment, doped region 103 and/or doped region 105 are configured for a p-type metal-oxide-semiconductor (PMOS) FinFET or an n-type MOS (NMOS) FinFET. For example, doped region 103 and/or doped region 105 is an n-type doped region, a p-type doped region, or a combination thereof. The various doped regions can be formed directly on and/or in substrate 102, for example, providing a p-well structure, an n-well structure, a dual-well structure, a raised structure, or combinations thereof. An ion implantation process, a diffusion process, and/or other suitable doping process can be performed to form the various doped regions.

Integrated circuit device 100 includes fins 104 (also referred to as fin structures 104 or active fin regions 104) disposed over substrate 102. Fins 104 are oriented substantially parallel to one another, each having a length defined in a Y-direction, a width defined in an X-direction, and a height defined in a z-direction. The present disclosure contemplates variations in height, width, and length of fins 104 that may arise from processing and fabrication. For example, in FIG. 3, a width of fins 104 varies from an upper portion of fins 104 to a lower portion of fins 104. In the depicted embodiment, the width tapers from the lower portion of fins 104 to the upper portion of fins 104, such that an average width of the upper portion is less than an average width of the lower portion. In some implementations, the width can vary from about 3 nm to about 20 nm along fins 104 depending on where the width is measured along the height of fins 104. In some implementations, a width of fins 104 varies depending on a position of fins 104 relative to one another and/or relative to other features of integrated circuit device 100. For example, a width of center fins may be greater than a width of edge fins. In another example, alternatively, a width of center fins is less than a width of edge fins. In both such implementations, the width of edge fins can represent an average width of edge fins, and the width of center fins can represent an average width of center fins.

Fins 104 each have at least one channel region, at least one source region, and at least one drain region defined along their length in the Y-direction, where a channel region is disposed between a source region and a drain region (generally referred to as source/drain regions). Channel regions include a top portion defined between sidewall portions, where the top portion and the sidewall portions engage with a gate structure (as described below), such that current can flow between the source/drain regions during operation. The source/drain regions also include top portions defined between sidewall portions. In some implementations, fins 104 are a portion of substrate 102 (such as a portion of a material layer of substrate 102). For example, where substrate 102 includes silicon, fins 104 include silicon. Alternatively, in some implementations, fins 104 are defined in a material layer, such as one or more semiconductor material layers, overlying substrate 102. For example, fins 104 can include a semiconductor layer stack having various semiconductor layers (such as a heterostructure) disposed over substrate 102. The semiconductor layers can include any suitable semiconductor materials, such as silicon, germanium, silicon germanium, other suitable semiconductor materials, or combinations thereof. The semiconductor layers can include same or different materials, etching rates, constituent atomic percentages, constituent weight percentages, thicknesses, and/or configurations depending on design requirements of integrated circuit device 100. In some implementations, the semiconductor layer stack includes alternating semiconductor layers, such as semiconductor layers composed of a first material and semiconductor layers composed of a second material. For example, the semiconductor layer stack alternates silicon layers and silicon germanium layers (for example, SiGe/Si/SiGe/Si/SiGe/Si from bottom to top). In some implementations, the semiconductor layer stack includes semiconductor layers of the same material but with alternating constituent atomic percentages, such as semiconductor layers having a constituent of a first atomic percent and semiconductor layers having the constituent of a second atomic percent. For example, the semiconductor layer stack includes silicon germanium layers having alternating silicon and/or germanium atomic percentages (for example, $Si_aGe_b/Si_cGe_d/Si_aGe_b/Si_cGe_d/Si_aGe_b/Si_cGe_d$ from bottom to top, where a, c are different atomic percentages of silicon and b, d are different atomic percentages of germanium).

Fins 104 are formed over substrate 102 by any suitable process. In some implementations, a combination of deposition, lithography and/or etching processes are performed to define fins 104 extending from substrate 102 as illustrated in FIG. 3. For example, forming fins 104 includes performing a lithography process to form a patterned resist layer over substrate 102 (or a material layer, such as a heterostructure, disposed over substrate 102) and performing an etching process to transfer a pattern defined in the patterned resist layer to substrate 102 (or the material layer, such as the heterostructure, disposed over substrate 102). The lithography process can include forming a resist layer on substrate 102 (for example, by spin coating), performing a pre-exposure baking process, performing an exposure process using a mask, performing a post-exposure baking process, and performing a developing process. During the exposure process, the resist layer is exposed to radiation energy (such as ultraviolet (UV) light, deep UV (DUV) light, or extreme UV (EUV) light), where the mask blocks, transmits, and/or reflects radiation to the resist layer depending on a mask pattern of the mask and/or mask type (for example, binary mask, phase shift mask, or EUV mask), such that an image is projected onto the resist layer that corresponds with the mask pattern. Since the resist layer is sensitive to radiation energy, exposed portions of the resist layer chemically change, and exposed (or non-exposed) portions of the resist layer are dissolved during the developing process depending on characteristics of the resist layer and characteristics of a developing solution used in the developing process. After development, the patterned resist layer includes a resist pattern that corresponds with the mask. The etching process uses the patterned resist layer as an etch mask to remove portions of substrate 102 (or a material layer disposed over substrate 102). The etching process can include a dry etching process (for example, a reactive ion etching (RIE) process), a wet etching process, other suitable etching process, or combinations thereof. After the etching process, the patterned resist layer is removed from substrate 102, for example, by a resist stripping process. Alternatively, fins 104 are formed by a multiple patterning process, such as a double patterning lithography (DPL) process (for example, a lithography-etch-lithography-etch (LELE) process, a self-aligned double patterning (SADP) process, a spacer-is-dielectric (SID) SADP process, other double patterning process, or combinations thereof), a triple patterning process (for example, a lithography-etch-lithography-etch-lithography-etch (LELELE) process, a self-aligned triple patterning (SATP) process, other triple patterning process, or combinations thereof), other multiple patterning process (for example, self-aligned quadruple patterning (SAQP) process), or combinations thereof. In some implementations, directed self-assembly (DSA) techniques are implemented while forming fins 104. Further, in some implementations, the exposure process can implement maskless lithography, electron-beam (e-beam) writing, ion-beam writing, and/or nanoimprint technology for patterning the resist layer and/or other layers.

An isolation feature(s) 106 is formed over and/or in substrate 102 to isolate various regions, such as various device regions, of integrated circuit device 100. For example, isolation feature 106 separates and isolates active device regions and/or passive device regions from each other, such as two FETs of integrated circuit device 100. Isolation feature 106 further separates and isolates fins 104 from one another. In the depicted embodiment, isolation feature 106 surrounds a bottom portion of fins 104. Isolation feature 106 includes silicon oxide, silicon nitride, silicon oxynitride, other suitable isolation material (for example, including silicon, oxygen, nitrogen, carbon, or other suitable isolation constituent), or combinations thereof. Isolation feature 106 can include different structures, such as shallow trench isolation (STI) structures, deep trench isolation (DTI) structures, and/or local oxidation of silicon (LOCOS) structures. In some implementations, STI features can be formed by etching a trench in substrate 102 (for example, by using a dry etch process and/or wet etch process) and filling the trench with insulator material (for example, by using a chemical vapor deposition process or a spin-on glass process). A chemical mechanical polishing (CMP) process may be performed to remove excessive insulator material and/or planarize a top surface of isolation feature 106. In some implementations, STI features can be formed by depositing an insulator material over substrate 102 after forming fins 104 (in some implementations, such that the insulator material layer fills gaps (trenches) between fins 104) and etching back the insulator material layer to form isolation feature 106. In some implementations, isolation feature 106 includes a multi-layer structure that fills trenches, such as a bulk dielectric layer disposed over a liner dielectric layer, where the bulk dielectric layer and the liner dielectric layer include materials depending on design requirements (for example, a bulk dielectric layer that includes silicon nitride disposed over a liner dielectric layer that includes thermal oxide). In some implementations, isolation feature 106 includes a dielectric layer disposed over a doped liner layer (including, for example, boron silicate glass (BSG) or phosphosilicate glass (PSG)).

Various gate structures are disposed over fins 104, such as a gate structure 110 shown in FIGS. 2 and 3. Gate structure 110 extends along the X-direction (for example, substantially perpendicular to fins 104). Gate structure 110 is disposed over respective channel regions of fins 104, thereby interposing respective source/drain regions of fins 104. Gate structure 110 can engage respective channel regions of fins 104, such that current can flow between respective source/drain regions of fins 104 during operation. In some implementations, gate structure 110 wrap respective channel regions of fins 104. Gate structure 110 include a gate stack configured to achieve desired functionality according to design requirements of integrated circuit device 100, such that gate structure 110 may include different layers and/or materials. Gate structure 110 has a gate stack that includes a gate dielectric 108 and a gate electrode 109. Gate dielectric 108 is conformally disposed over fins 104 and isolation feature 106, such that gate dielectric 108 has a substantially uniform thickness. In the depicted embodiment, gate dielectric 108 is disposed on sidewall surfaces and bottom surfaces of integrated circuit device 100 defining gate structures 110. Gate dielectric 108 includes a dielectric material, such as silicon oxide, high-k dielectric material, other suitable dielectric material, or combinations thereof. In the depicted embodiment, gate dielectric 108 includes a high-k dielectric material (and thus may be referred to as a high-k dielectric layer), such as hafnium dioxide ($HfO_2$), HfSiO, HfSiON, HfTaO, HfTiO, HfZrO, zirconium oxide, aluminum oxide, hafnium dioxide-alumina ($HfO_2$—$Al_2O_3$) alloy, other suitable high-k dielectric material, or combinations thereof. High-k dielectric material generally refers to dielectric materials having a high dielectric constant, for example, greater than that of silicon oxide ($k \approx 3.9$). In some implementations, gate dielectric 108 further includes an interfacial layer (including a dielectric material, such as silicon oxide) disposed between the high-k dielectric layer and fins 104.

Gate electrode 109 is disposed over gate dielectric 108. Gate electrode 109 includes an electrically conductive material. In some embodiments, gate electrode 109 includes a capping layer, one or more work function layers, a glue/barrier layer, and a metal fill (or bulk) layer. The capping layer is conformally disposed over gate dielectric 108, such that the capping layer has a substantially uniform thickness. The Capping layer may include a material that prevents or eliminates diffusion and/or reaction of constituents between gate dielectric 108 and other layers of the gate structure 110. In some implementation, the capping layer includes a metal and nitrogen, such as titanium nitride (TiN), tantalum nitride (TaN), tungsten nitride ($W_2N$), titanium silicon nitride (TiSiN), tantalum silicon nitride (TaSiN), or combinations thereof. The one or more work function layers are conformally disposed over the capping layer. The one or more work function layers may include a conductive material tuned to have a desired work function (such as an n-type work function or a p-type work function), such as n-type work function materials and/or p-type work function materials. P-type work function materials include TiN, TaN, Ru, Mo, Al, WN, $ZrSi_2$, $MoSi_2$, $TaSi_2$, $NiSi_2$, WN, other p-type work function material, or combinations thereof. N-type work function materials include Ti, Al, Ag, Mn, Zr, TiAl, TiAlC, TaC, TaCN, TaSiN, TaAl, TaAlC, TiAlN, other n-type work function material, or combinations thereof. The glue/barrier layer is conformally disposed over the one or more work function layers. The glue/barrier layer includes a material that promotes adhesion between adjacent layers, such as the one or more work function layers and metal fill layer, and/or a material that blocks and/or reduces diffusion between gate layers, such as the one or more work function layers and metal fill layer. For example, the glue/barrier layer may include metal (for example, W, Al, Ta, Ti, Ni, Cu, Co, other suitable metal, or combinations thereof), metal oxides, metal nitrides, or combinations thereof. In the depicted embodiment, the glue/barrier layer includes titanium and nitrogen, such as TiN. The metal fill layer is disposed over the glue/barrier layer. The metal fill layer includes a suitable conductive material, such as Al, W, and/or Cu. In the depicted embodiment, the metal fill layer includes W. The metal fill layer may additionally or collectively include other metals, metal oxides, metal nitrides, other suitable materials, or combinations thereof. Gate dielectric 108 and/or gate electrode 109 may include numerous other layers, for example, capping layers, interface layers, diffusion layers, barrier layers, hard mask layers, or combinations thereof.

The gate stack of the gate structure 110 may be fabricated according to a gate last process, a gate first process, or a hybrid gate last/gate first process. In gate last process implementations, the gate structure 110 include a dummy gate stack that is subsequently replaced with a metal gate stack (generally referred to as a gate replacement process). The dummy gate stack includes, for example, an interfacial layer (including, for example, silicon oxide) and a dummy gate electrode layer (including, for example, polysilicon). In such implementations, the dummy gate electrode layer is removed to form openings (trenches) in which gate dielectric 108 and/or gate electrode 109 are subsequently formed. Gate last processes and/or gate first processes can implement deposition processes, lithography processes, etching processes, other suitable processes, or combinations thereof. The deposition processes include CVD, physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), plating, other suitable methods, or combinations thereof. The lithography patterning processes include resist coating (for example, spin-on coating), soft baking, mask aligning, exposure, post-exposure baking, developing the resist, rinsing, drying (for example, hard baking), other suitable processes, or combinations thereof. Alternatively, the lithography exposure process is assisted, implemented, or replaced by other methods, such as maskless lithography, e-beam writing, or ion-beam writing. The etching processes include dry etching processes, wet etching processes, other etching processes, or combinations thereof.

The gate structure 110 further includes respective gate spacers 113 disposed adjacent to (for example, along sidewalls of) the respective gate stacks. Gate spacers 113 are formed by any suitable process and include a dielectric material. The dielectric material can include silicon, oxygen, carbon, nitrogen, other suitable material, or combinations thereof (for example, silicon oxide, silicon nitride, silicon oxynitride, or silicon carbide). For example, in the depicted embodiment, a dielectric layer including silicon and nitrogen, such as a silicon nitride layer, can be deposited over substrate 102 and subsequently anisotropically etched to form gate spacers 113. In some implementations, gate spacers 113 include a multi-layer structure, such as a first dielectric layer that includes silicon nitride and a second dielectric layer that includes silicon oxide. In some implementations, gate spacers 113 include more than one set of spacers, such as seal spacers, offset spacers, sacrificial spacers, dummy spacers, and/or main spacers, formed adjacent to the gate stacks. In such implementations, the various sets of spacers can include materials having different etch rates. For example, a first dielectric layer including silicon and oxygen can be deposited over substrate 102 and subsequently anisotropically etched to form a first spacer set adjacent to the gate stacks, and a second dielectric layer including silicon and nitrogen can be deposited over substrate 102 and subsequently anisotropically etched to form a second spacer set adjacent to the first spacer set. Implantation, diffusion, and/or annealing processes may be performed to form lightly doped source and drain (LDD) features and/or heavily doped source and drain (HDD) features in fins 104 before and/or after forming gate spacers 113.

Epitaxial source features and epitaxial drain features (referred to as epitaxial source/drain features) are disposed over the source/drain regions of fins 104. For example, semiconductor material is epitaxially grown on fins 104, forming epitaxial source/drain features 112. In some implementations, epitaxial source/drain features 112 are formed over the source/drain regions of fins 104 after a fin recess process (for example, an etch back process), such that epitaxial source/drain features 112 are grown from recessed fins 104. In some implementations, epitaxial source/drain features 112 wrap the source/drain regions of fins 104. In such implementations, fins 104 may not be subjected to a fin recess process. Epitaxial source/drain features 112 extend (grow) laterally along the y-direction (in some implementations, epitaxial source/drain features that span more than one fin (for example, each of the epitaxial source/drain features 112 span two of fins 104). An epitaxy process can implement CVD deposition techniques (for example, vapor-phase epitaxy (VPE), ultra-high vacuum CVD (UHV-CVD), LPCVD, and/or PECVD), molecular beam epitaxy, other suitable SEG processes, or combinations thereof. The epitaxy process can use gaseous and/or liquid precursors, which interact with the composition of substrate 102. Epitaxial source/drain features 112 are doped with n-type dopants and/or p-type dopants. In some implementations, one or more of epitaxial source/drain features 112 are epitaxial layers including silicon and/or germanium, where the silicon germanium containing epitaxial layers are doped with boron, carbon, other p-type dopant, or combinations thereof (for example, forming a Si:Ge:B epitaxial layer). In some implementations, one or more of epitaxial source/drain features 112 are epitaxial layers including silicon and/or carbon, where silicon-containing epitaxial layers or silicon-carbon-containing epitaxial layers are doped with phosphorous, arsenic, other n-type dopant, or combinations thereof (for example, forming a Si:P epitaxial layer or a Si:C:P epitaxial layer). In some implementations, epitaxial source/drain features 112 include materials and/or dopants that achieve desired tensile stress and/or compressive stress in the channel regions. In some implementations, epitaxial source/drain features 112 are doped during deposition by adding impurities to a source material of the epitaxy process. In some implementations, epitaxial source/drain features 112 are doped by an ion implantation process subsequent to a deposition process. In some implementations, annealing processes are performed to activate dopants in epitaxial source/drain features 112 and/or other source/drain regions of integrated circuit device 100, such as HDD regions and/or LDD regions (both of which are not shown in FIGS. 2 and 3).

An interlevel dielectric (ILD) layer 114 is disposed over substrate 102, particularly over fins 104 and the gate structure 110. In some implementations, ILD layer 114 is a portion of a multilayer interconnect (MLI) feature that electrically couples various devices (for example, transistors, resistors, capacitors, and/or inductors) and/or components (for example, gate structures and/or source/drain features) of integrated circuit device 100, such that the various devices and/or components can operate as specified by design requirements of integrated circuit device 100. ILD layer 114 includes a dielectric material including, for example, silicon oxide, silicon nitride, silicon oxynitride, TEOS formed oxide, PSG, BPSG, low-k dielectric material, other suitable dielectric material, or combinations thereof. Exemplary low-k dielectric materials include FSG, carbon doped silicon oxide, Black Diamond® (Applied Materials of Santa Clara, Calif.), Xerogel, Aerogel, amorphous fluorinated carbon, Parylene, BCB, SILK (Dow Chemical, Midland, Mich.), polyimide, other low-k dielectric material, or combinations thereof. In some implementations, ILD layer 114 has a multilayer structure having multiple dielectric materials. In some implementations, a contact etch stop layer (CESL) is disposed between ILD layer 114 and fins 104 and/or the gate structure 110. The CESL includes a material different than ILD layer 114. In the depicted embodiment, where ILD layer 114 includes a low-k dielectric material, the CESL includes silicon and nitrogen (for example, silicon nitride or silicon oxynitride). ILD layer 114 and/or the CESL is formed over substrate 102, for example, by a deposition process (such as CVD, PVD, ALD, HDPCVD, MOCVD, RPCVD, PECVD, LPCVD, ALCVD, APCVD, plating, other suitable methods, or combinations thereof). In some implementations, ILD layers 114 and/or the CESL are formed by a flowable CVD (FCVD) process that includes, for example, depositing a flowable material (such as a liquid compound) over substrate 102 and converting the flowable material to a solid material by a suitable technique, such as thermal annealing and/or ultraviolet radiation treating. Subsequent to the deposition of ILD layer 114 and/or the CESL, a CMP process and/or other planarization process is performed, such that a top portion of the gate structure 110 is reached (exposed). It is noted that FIG. 2 illustrates see-through views of the fins 104 and the source/drain features 112 as they are covered by the ILD layer 114.

Figure 4:
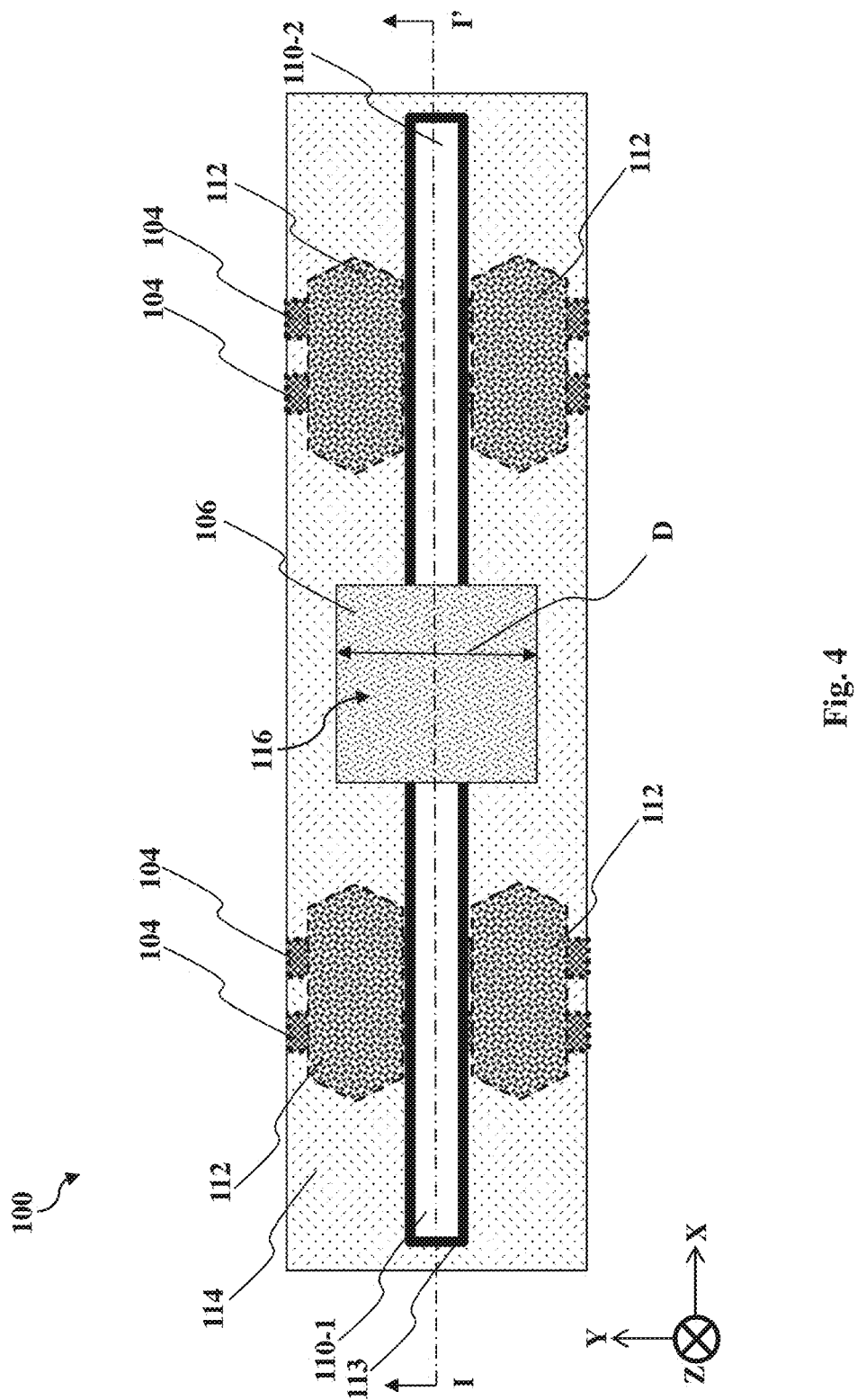
Figure 5:
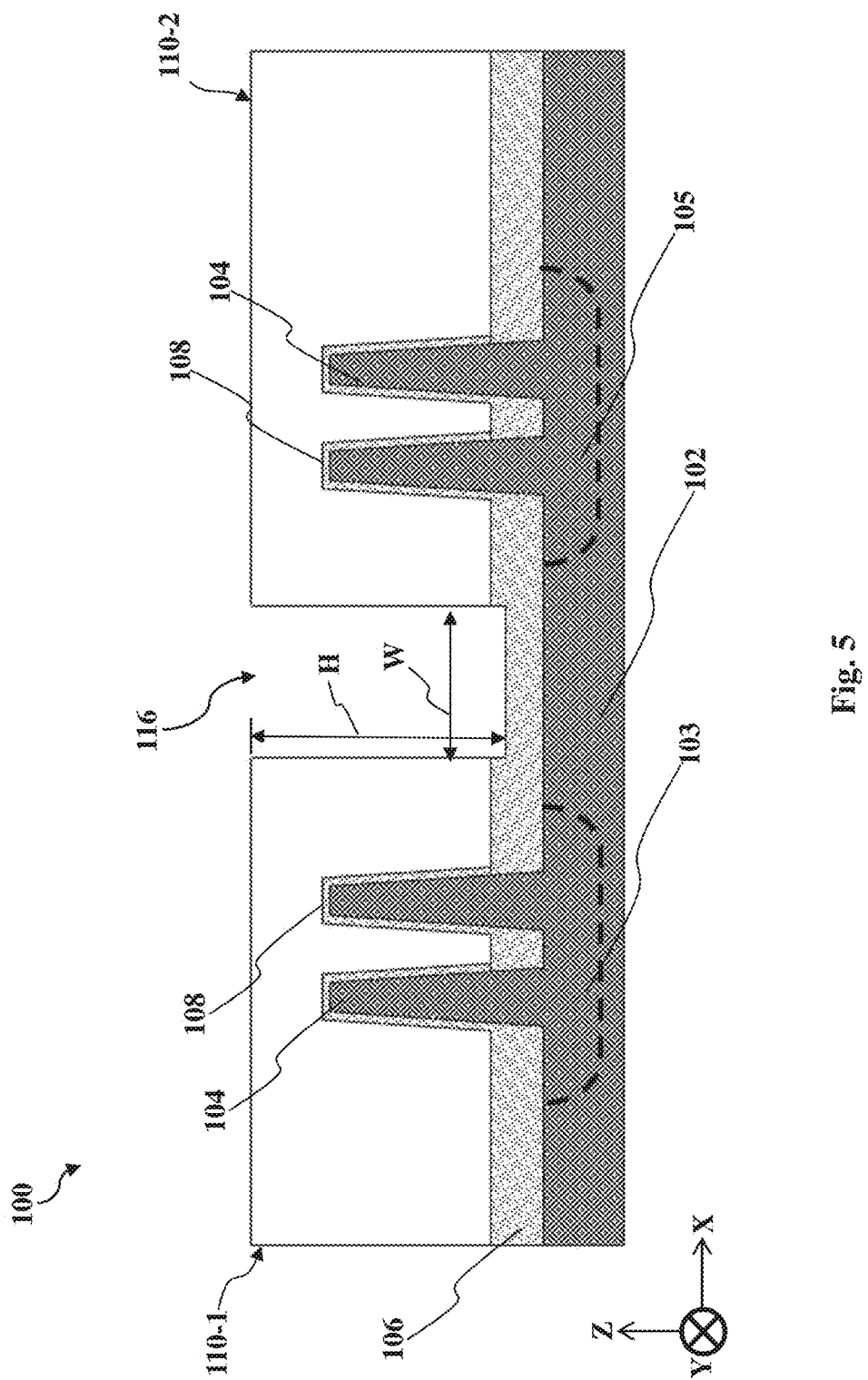

Referring to FIGS. 1, 4 and 5, method 10 includes a block 14 where a gate cut process is performed to form a gate cut opening 116 separating the gate structure 110 into a first gate structure segment 110-1 and a second gate structure segment 110-2. FIG. 4 is a fragmentary top view of the integrated circuit device 100 and FIG. 5 is a fragmentary cross-sectional view of the integrated circuit device 100 along cross section I-I' in FIG. 4. The gate cut process includes photolithography operations. For example, a patterning layer may be formed over integrated circuit device 100 (in particular, over the gate structure 110 and ILD layer 114), where the patterning layer includes an opening that exposes a portion of the gate structure 110. The patterning layer is used to remove (or cut) a portion of the gate structure 110 to form the gate cut opening 116, separating the gate structure 110 into a first gate structure segment 110-1 and a second gate structure segment 110-2. The patterning layer is thus alternatively referred to as a gate cut mask. In furtherance of the depicted embodiment, dimensions of the opening are selected such that a subsequent etching process may completely sever the gate structure 110 and that the subsequent etching process does not expose or damage the source/drain features 112.

The patterning layer may include a material that is different than a material of the gate structure 110 (in particular, a material of gate spacers 113, a material of gate electrode 109, and a material of gate dielectric 108) and ILD layer 114 to achieve etching selectivity during subsequent etching processes. In some implementations, the patterning layer may include silicon, amorphous silicon, semiconductor oxide (for example, silicon oxide ($SiO_2$)), semiconductor nitride (for example, silicon nitride (SiN)), semiconductor oxynitride (for example, silicon oxynitride (SiON)), and/or semiconductor carbide (for example, silicon carbide (SiC)), other semiconductor material, and/or other dielectric material. In some implementations, the patterning layer includes a resist material (and thus may be referred to as a patterned resist layer and/or a patterned photoresist layer). In some implementations, the patterning layer has a multi-layer structure.

The patterning layer is formed by deposition processes, lithography processes, and/or etching processes. The patterning layer (or layers in the patterning layer) is deposited over integrated circuit device 100 by CVD, PVD, ALD, HDPCVD, MOCVD, RPCVD, PECVD, LPCVD, ALCVD, APCVD, plating, other suitable deposition process, or combinations thereof. The opening in the patterning layer is then formed by performing a lithography process to form a patterned resist layer over the patterning layer and performing an etching process to transfer a pattern defined in the patterned resist layer to the patterning layer. The lithography process can include forming a resist layer on the patterning layer (for example, by spin coating), performing a pre-exposure baking process, performing an exposure process using a mask, performing a post-exposure baking process, and performing a developing process. During the exposure process, the resist layer is exposed to radiation energy (such as UV light, DUV light, or EUV light), where the mask blocks, transmits, and/or reflects radiation to the resist layer depending on a mask pattern of the mask and/or mask type (for example, binary mask, phase shift mask, or EUV mask), such that an image is projected onto the resist layer that corresponds with the mask pattern. Since the resist layer is sensitive to radiation energy, exposed portions of the resist layer chemically change, and exposed (or non-exposed) portions of the resist layer are dissolved during the developing process depending on characteristics of the resist layer and characteristics of a developing solution used in the developing process. After development, the patterned resist layer includes a resist pattern that corresponds with the mask. The etching process uses the patterned resist layer as an etch mask to remove portions of patterning layer. The etching process can include a dry etching process, a wet etching process, other suitable etching process, or combinations thereof. In some implementations, a dry etching process implements fluorine-containing gas (for example, $CF_4$, $SF_6$, $CH_2F_2$, $CHF_3$, and/or $C_2F_6$), chlorine-containing gas (for example, $Cl_2$, $CHCl_3$, $CCl_4$, and/or $BCl_3$), bromine-containing gas (for example, HBr and/or $CHBr_3$), iodine-containing gas, other suitable gases and/or plasmas, and/or combinations thereof. In some implementations, a wet etching process uses an etching solution that includes ammonium hydroxide ($NH_4OH$), hydrogen peroxide ($H_2O_2$), sulfuric acid ($H_2SO_4$), tetramethylammonium hydroxide (TMAH), hydrogen chloride (HCl), other suitable wet etching solution, or combinations thereof. For example, the wet etching solution utilizes an $NH_4OH$:$H_2O_2$ solution, an HCl:$H_2O_2$:$H_2O$ solution (known as an hydrochloric-peroxide mixture (HPM)), an $NH_4OH$:$H_2O_2$:$H_2O$ solution (known as an ammonia-peroxide mixture (APM)), or an $H_2SO_4$:$H_2O_2$ solution (known as a sulfuric peroxide mixture (SPM)). After the etching process, the patterned resist layer is removed from the patterning layer, for example, by a resist stripping process. Alternatively, the exposure process can be implemented or replaced by other methods, such as mask-less lithography, e-beam writing, ion-beam writing, and/or nanoimprint technology.

The gate structure 110 and the ILD layer 114 are then etched, using the patterned patterning layer as an etch mask, to form the gate cut opening 116. As illustrated in FIGS. 4 and 5, the gate structure 110 is divided by the gate cut opening 116 into the first gate structure segment 110-1 and the second gate structure segment 110-2. In some embodiments represented in FIGS. 4 and 5, as the etch process substantially removes the gate structure 110 (including the gate dielectric 108, the gate electrode 109, the gate spacers 113 in the gate cut opening 116), the isolation feature 106 is exposed after the etch process. In some implementations, a portion of the isolation feature 106 is also etched and removed to ensure that the gate structure 110 is completely severed. In the depicted embodiment, the gate cut opening 116 (also referred to as a gate cut window or a gate cut region) has a span D that extends in a direction substantially parallel to fins 104 (here, in the Y-direction), a width W that extends in a direction substantially parallel to the gate structure 110 (here, in the X-direction), and a height H that extends in a direction substantially perpendicular to both the fins 104 and the gate structure 110 (here, in the Z-direction). In some instances, W is between about 10 nm and 100 nm, and H is between about 50 nm and about 200 nm. The range of the span D depends on the number of gate structures and the Y-direction dimension of a gate structure ($L_{gate}$). If only one gate structure is to be separated by the gate cut process, the span D may be in the range between $L_{gate}$ (~$L_{gate}$) and about 50 nm more than $L_{gate}$ (~$L_{gate}$+50 nm). If a plurality of gate structures are to be cut by the gate cut process, the span D may be substantially identical to the end-to-end dimension of the two outermost gate structures or about 50 nm more than that end-to-end dimension. Although each of the first and second gate structure segments 110-1 and 110-2 in the illustrated embodiments extends over two fins 104, the present disclosure is not so limited and contemplates embodiments where each of the gate structure segments 110-1 and 110-2 is disposed over more or less fins 104.

Figure 6:
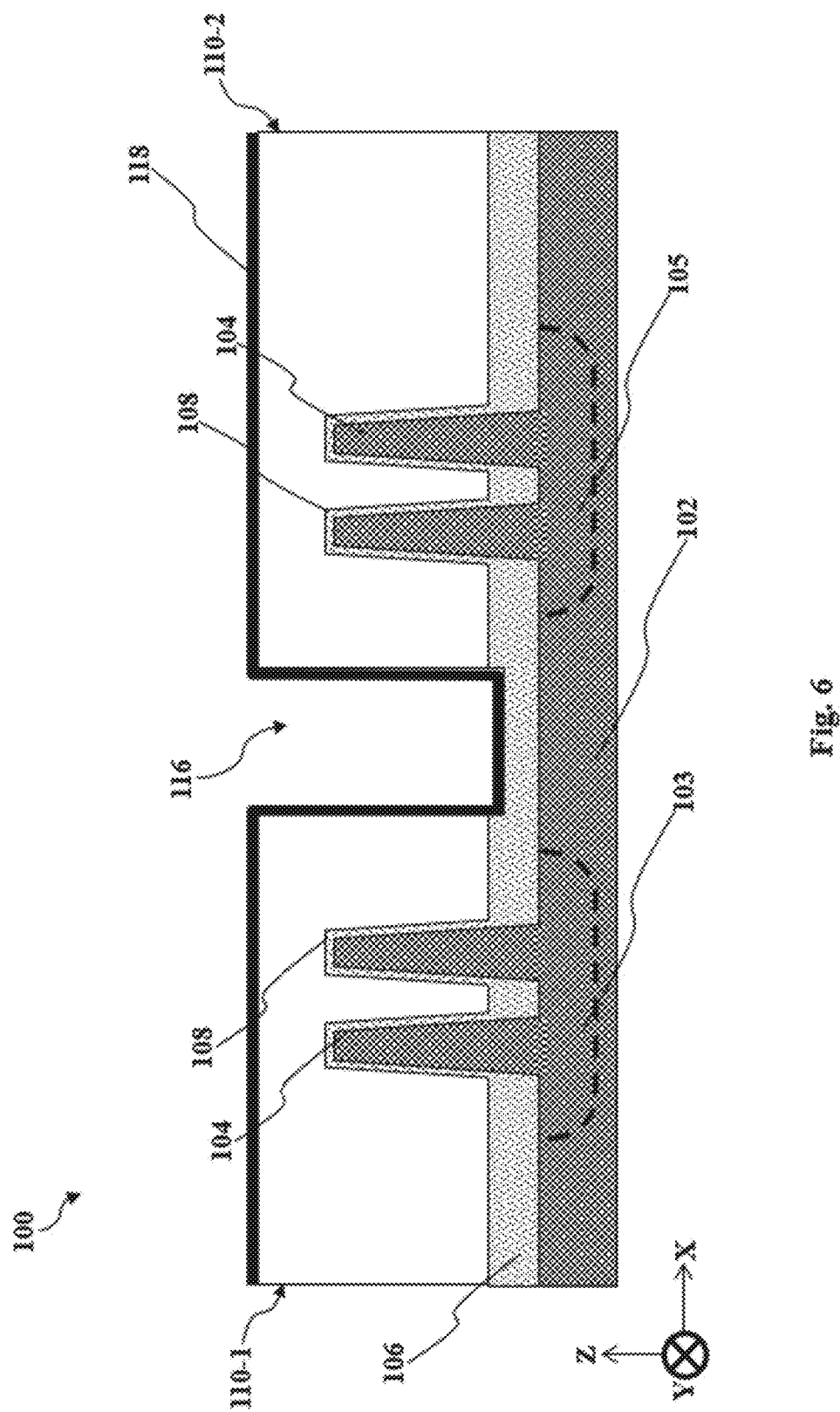

Referring to FIGS. 1 and 6, method 10 includes a block 16 where a first dielectric layer 118 is deposited in the gate cut opening 116. The first dielectric layer 118 includes an oxygen-free dielectric material that does not supply oxygen and acts as a diffusion barrier of oxygen atoms. In some embodiments, the first dielectric layer 118 includes semiconductor nitride, such as silicon nitride and is conformally deposited over the integrated circuit device workpiece 100 using ALD, PECVD, PEALD, or other suitable technique. As the first dielectric layer 118 is formed of a dielectric material with a dielectric constant (~9.5) greater than that of silicon oxide (~3.9) and a thicker first dielectric layer 118 would increase gate-to-gate capacitance, the first dielectric layer 118 should be as thin as possible so far as it can still block oxygen diffusion into the first and second gate structure segments 110-1 and 110-2. In addition, it has been observed that the first dielectric layer 118 can no longer block oxygen diffusion when its thickness is below 1 nm. Based on these considerations, in some implementations, a thickness of the first dielectric layer 118 is between about 1 nm and about 10 nm. Because the first dielectric layer 118 functions to block oxygen diffusion, it may be referred to as an oxygen blocking layer.

Figure 7:
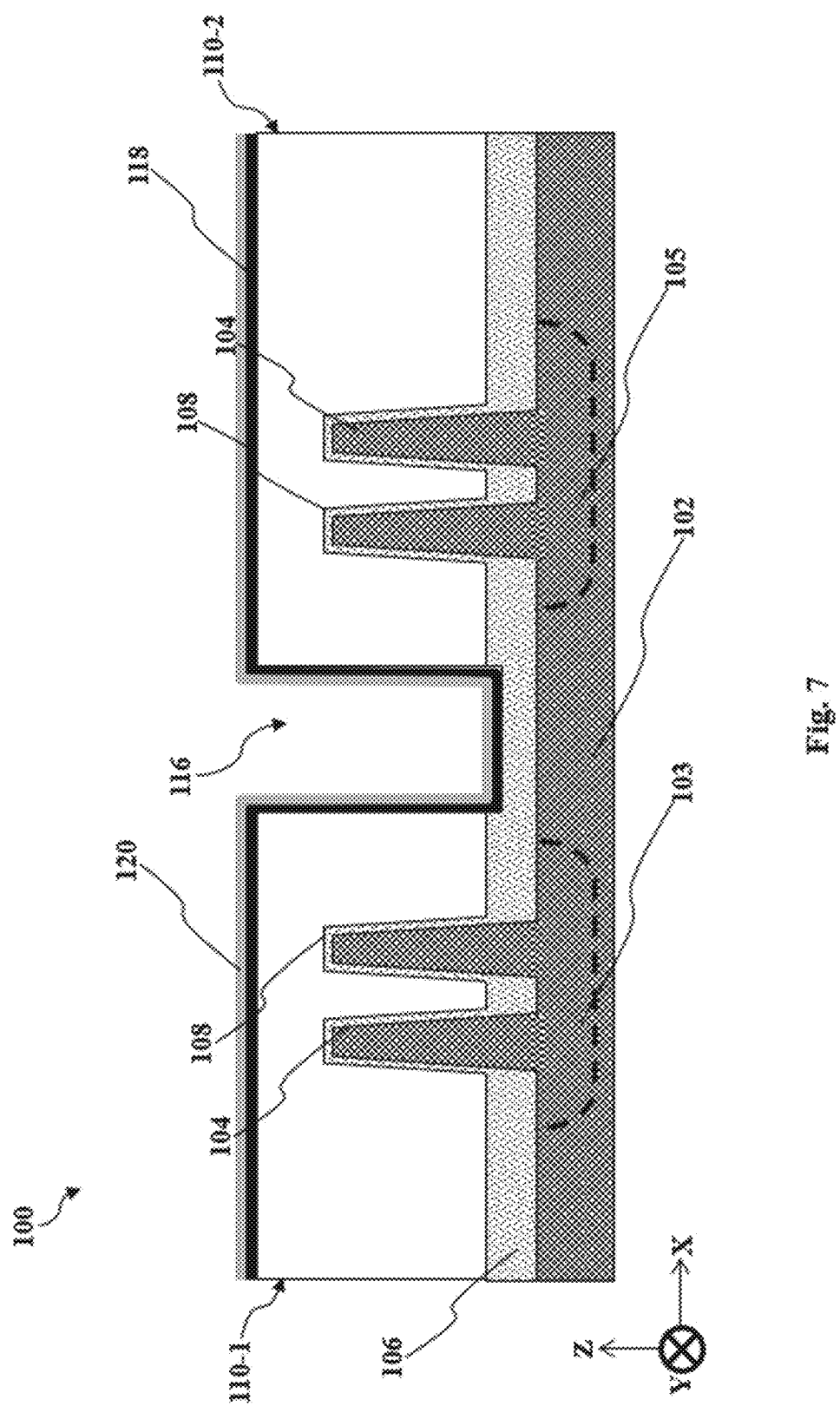

Referring to FIGS. 1 and 7, method 10 includes a block 18 where a silicon layer 120 is deposited in the gate cut opening 116 over the first dielectric layer 118. In some embodiments, the silicon layer 120 may be a polysilicon layer conformally deposited using ALD, CVD, PEALD, or other suitable method. In these embodiments, silicon-containing precursors, such as silicon hydrides or silicon halides. In some implementations the silicon layer 120 may be formed using silane and trichlorosilane in an ALD process. In some alternative embodiments, the silicon layer 120 may be a single crystalline layer formed by selective epitaxy. In these alternative embodiments, a silicon containing precursor that may selectively attach to the first dielectric layer 118 is used in an epitaxy process, such as vapor-phase epitaxy (VPE), ultra-high vacuum CVD (UHV-CVD), LPCVD, and/or PECVD), molecular beam epitaxy, other suitable SEG processes, or combinations thereof. As the silicon layer 120 is formed of a silicon with a dielectric constant (~11.7) greater than that of silicon oxide (~3.9) and a thicker silicon layer 120 would increase gate-to-gate capacitance, the silicon layer 120 should be as thin as possible so far as it can trap oxygen atoms diffusing therein. In addition, it has been observed that the silicon layer 120 can no longer trap oxygen atoms when its thickness is below 0.5 nm. Based on these considerations, in some implementations, a thickness of the silicon layer 120 is between about 0.5 nm and about 6 nm. Because the silicon layer 120 functions to trap oxygen atoms to prevent them from diffusing into the first and second gate structure segments 110-1 and 110-2, it may be referred to as an oxygen trap layer.

Figure 8:
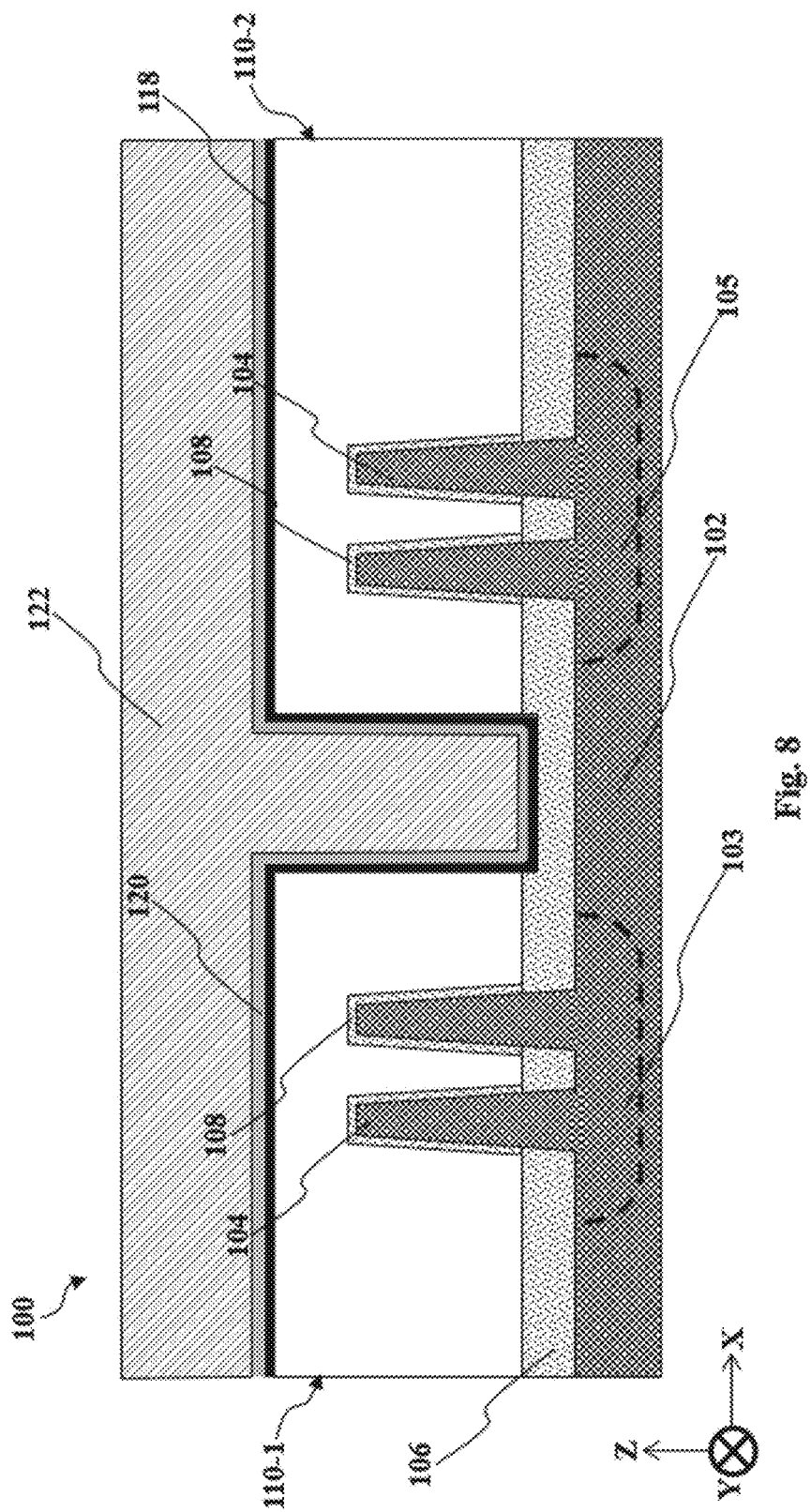

Referring to FIGS. 1 and 8, method 10 includes a block 20 where a second dielectric layer 122 is deposited over the silicon layer 120 to fill the gate cut opening 116. In some embodiments, the second dielectric layer 122 may be formed of dielectric material that has a dielectric constant smaller than that of silicon nitride (between about 5 and about 10). In some implementations, the second dielectric layer 122 includes semiconductor oxide, such as silicon oxide, and may be deposited using CVD, ALD, PECVD, PEALD, or other suitable method. In some other implementations, the second dielectric layer 122 may be formed with a spin-on glass process using TEOS formed oxide, PSG, BPSG, low-k dielectric material, other suitable dielectric material, or combinations thereof. Exemplary low-k dielectric materials include FSG, carbon doped silicon oxide, Black Diamond® (Applied Materials of Santa Clara, Calif.), Xerogel, Aerogel, amorphous fluorinated carbon, Parylene, BCB, SILK (Dow Chemical, Midland, Mich.), polyimide, other low-k dielectric material, or combinations thereof.

Figure 9:
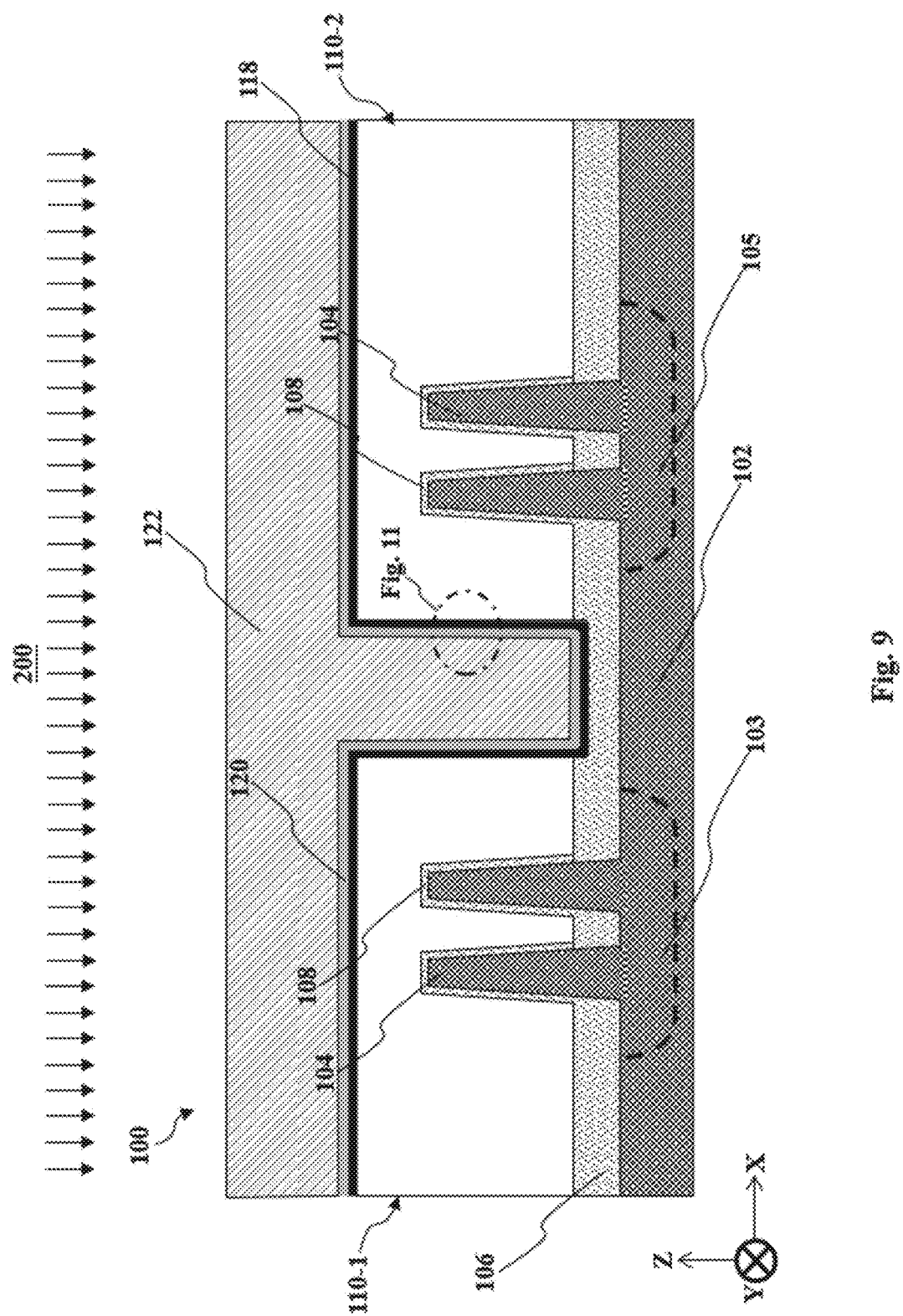

Referring to FIGS. 1 and 9, method 10 optionally includes a block 22 where an anneal process 200 is performed to anneal the second dielectric layer 122. In some embodiments, the anneal process 200 is performed to cure and densify the second dielectric layer 122 before commencement of further processing. In those embodiments, the anneal process 200 includes a temperature between 400° C. and about 600° C., such as between about 400° C. and about 500° C. In some alternative embodiments, the anneal process 200 at block 22 may be omitted and the second dielectric layer 122 is cured and densified when further thermal processes are performed to the integrated circuit device workpiece 100.

Regardless whether the second dielectric layer 122 is annealed at block 22 or annealed during the course of subsequent fabrication, oxygen from the second dielectric layer 122 may diffuse into the silicon layer 120 to transform the silicon layer 120 into a transition layer 120. The transition layer 120 is characterized by an oxygen content distribution representatively shown in FIG. 11. As illustrated in FIG. 11, the second dielectric layer 122 includes silicon oxide with an oxygen content expressed as $SiO_X$. As the second dielectric layer 122 may be regarded as a source of oxygen, its oxygen content throughout its thickness along the X direction may be substantially uniform even after some oxygen atoms diffuses into the transition layer 120. In some instances, oxygen content in the second dielectric layer 122 remains greater than that in the transition layer 120. Unlike the second dielectric layer 122, the portion of the transition layer 120 adjacent to the second dielectric layer 122 may be more oxygen-rich than the portion of the transition layer 120 away from the second dielectric layer 122. In this regard, oxygen content in the portion of the transition layer 120 adjacent to the second dielectric layer 122 may be expressed as $SiO_Y$, and the oxygen content in the portion of the transition layer 120 away from the second dielectric layer 122 may be expressed as $SiO_Z$. In embodiments of the present disclosure, X is greater than Y and Y is greater than Z. In some implementations where modest subsequent annealing is performed, X is between 1 and 2, Y is between 1 and 2 and Z may be less than 1. In embodiments where more extensive subsequent annealing is performed, X, Y, and Z may all be inching towards 2 and therefore may be substantially the same.

Figure 10:
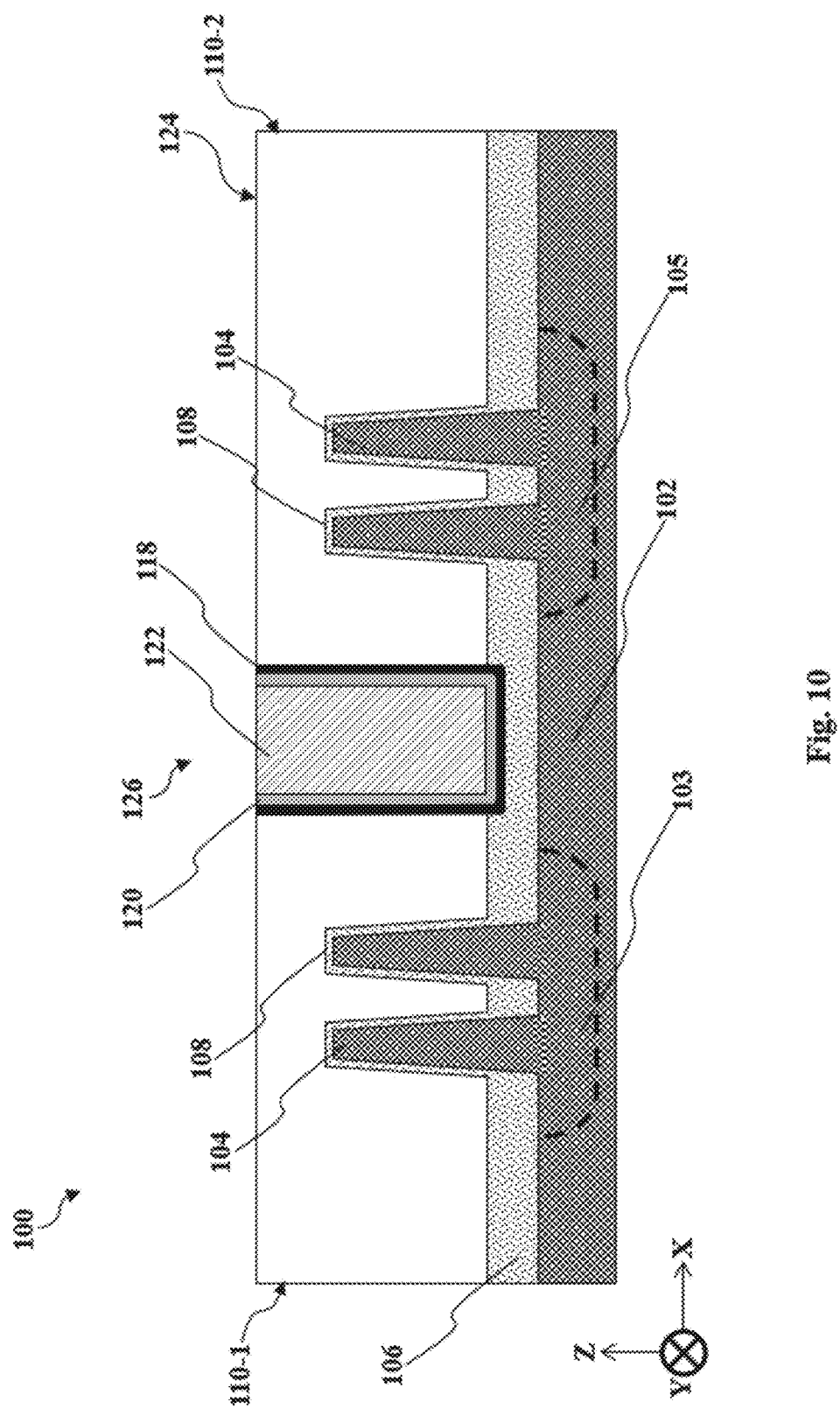

Referring to FIGS. 1 and 10, method 10 includes a block 24 where the integrated circuit device workpiece 100 is planarized. In some embodiments, the integrated circuit device workpiece 100 may be planarized using chemical mechanical polishing (CMP) or another suitable method to remove the first dielectric layer 118, the silicon layer 120, and the second dielectric layer 122 over the first and second gate structure segments 110-1 and 110-2 (as well as over the ILD layer 114, not shown in FIG. 10) to provide a level surface 124. The planarized first dielectric layer 118, silicon layer 120, and second dielectric layer 122 between the first gate structure segment 110-1 and the second gate structure segment 110-2 collectively form the gate cut dielectric feature 126.

Referring to FIG. 1, method 10 includes a block 26 where further processes are performed to complete fabrication of the integrated circuit device 100. Such further processes may include formation of various contact structures to facilitate operation of integrated circuit device 100. For example, one or more ILD layers, similar to ILD layer 114, may be formed over substrate 102. Contacts may then be formed in the one or more ILD layers. For example, gate contacts may be respectively electrically coupled with the first and second gate structure segments 110-1 and 110-2, and source/drain contacts may be respectively electrically coupled to the source/drain features 112. These contacts include a conductive material, such as metal. Metals include aluminum, aluminum alloy (such as aluminum/silicon/copper alloy), copper, copper alloy, titanium, titanium nitride, tantalum, tantalum nitride, tungsten, polysilicon, metal silicide, other suitable metals, or combinations thereof. In some instances, a metal silicide is formed at the interface between the source/drain features 112 and the source/drain contacts. The metal silicide may include nickel silicide, cobalt silicide, tungsten silicide, tantalum silicide, titanium silicide, platinum silicide, erbium silicide, palladium silicide, or combinations thereof.

Gate cutting techniques for integrated circuit devices, particularly for multi-gate transistor devices, are disclosed in the present disclosure. The gate cutting techniques and related gate cut dielectric features disclosed herein may be implemented in any of a variety of device types. For example, aspects of the present disclosure may be implemented to form gate structures suitable for planar field-effect transistors (FETs), multi-gate transistors (planar or vertical), such as fin-like FET (FinFET) devices, gate-all-around (GAA) devices, omega-gate (Ω-gate) devices, or pi-gate (Π-gate) devices, as well as strained-semiconductor devices, silicon-on-insulator (SOI) devices, partially-depleted SOI devices, fully-depleted SOI devices, or other devices. The present disclosure contemplates that one of ordinary skill may recognize other integrated circuit devices that can benefit from the gate cutting techniques and/or gate structures described herein.

The present disclosure provides a multi-layer gate cut dielectric feature for dividing a metal gate structure into separate gate structure segments and methods of forming the multi-layer gate cut dielectric feature. The multi-layer gate cut dielectric feature according to embodiments of the present disclosure includes a silicon nitride layer functioning as an oxygen blocking layer to block oxygen diffusion and a transition layer functioning as an oxygen trap layer to trap oxygen atoms. The silicon nitride layer and the transition layer make it possible to have a substantial portion of the gate cut dielectric feature to be formed of silicon oxide while threshold voltage variation due to oxygen diffusion is minimized. The gate cut dielectric feature of the present disclosure results in reduced gate-to-gate capacitance and improved device performance.

The present disclosure provides embodiments of integrated circuit devices and methods. In one embodiment, the present disclosure provides an integrated circuit device that includes a first multi-gate active region over a substrate, a second multi-gate active region over the substrate, a first gate structure over the first multi-gate active region, a second gate structure over the second multi-gate active region, and a dielectric feature disposed between the first gate structure and the second gate structure. The dielectric feature includes an oxygen-free layer in contact with the first gate structure and the second gate structure, a silicon oxide layer over the oxygen-free layer, and a transition layer disposed between the oxygen-free layer and the silicon oxide layer, wherein an oxygen content of the transition layer is smaller than an oxygen content of the silicon oxide layer.

In some embodiments, the first and second multi-gate active regions extend in parallel along a first direction and the first and second gate structures are aligned along a second direction perpendicular to the first direction. In some implementations, the integrated circuit device further includes an isolation feature extending between the first multi-gate active region and the second multi-gate active region and the dielectric feature extends into the isolation feature to completely separate the first gate structure and the second gate structure. In some embodiments, the integrated circuit device further includes a first source/drain feature over the first multi-gate active region and a second source/drain feature over the second multi-gate active region. A portion of the dielectric feature extends between the first source/drain feature and the second source/drain feature such that a portion of the transition layer extends between the first source/drain feature and the second source/drain feature. In some instances, the oxygen-free layer includes silicon nitride. In some embodiments, where the transition layer includes a first interface with the oxygen-free layer and a second interface with the silicon oxide layer and an oxygen content of the first interface is smaller than an oxygen content of the second interface. In some implementations, the oxygen-free layer includes a thickness between about 1 nm and about 10 nm. In some embodiments, the transition layer includes a thickness between about 0.5 nm and about 6 nm.

In another embodiment, the present disclosure provides a method that includes receiving an integrated circuit device workpiece that includes a gate structure, performing a gate cut process to separate the gate structure into a first gate structure and a second gate structure by a gate cut opening, depositing an oxygen-free dielectric layer over the integrated circuit device workpiece and into the gate cut opening, forming a silicon layer over the oxygen-free dielectric layer, depositing a silicon oxide layer over the silicon layer; and planarizing the integrated circuit device workpiece to expose the first gate structure and the second gate structure.

In some embodiments, the depositing of the oxygen-free dielectric layer includes conformally depositing a silicon nitride layer over the integrated circuit device workpiece. In some implementations, the forming of the silicon layer includes epitaxially growing the silicon layer on the oxygen-free dielectric layer. In some implementations, the forming of the silicon layer includes use of a derivative of silane. In some embodiments, the method further includes annealing the integrated circuit device workpiece to densify the silicon oxide layer. In some embodiments, the annealing includes an anneal temperature between about 400° C. and about 600° C. In some instances, the annealing of the integrated circuit device workpiece causes diffusion of oxygen from the silicon oxide layer into the silicon layer to partially oxidize the silicon layer. In some embodiments, the gate structure includes a metal.

In yet another embodiment, the present disclosure provides a method that includes receiving an integrated circuit device workpiece that includes a metal gate structure, performing a gate cut process to form a gate cut opening to separate the gate structure into a first metal gate structure and a second metal gate structure, conformally depositing a silicon nitride layer over sidewalls and a bottom surface of the gate cut opening, conformally forming a silicon layer over the silicon nitride layer, depositing a silicon oxide layer over the silicon layer to fill the gate cut opening, and planarizing the integrated circuit device workpiece such that a top surface of the silicon oxide layer is substantially level with a top surface of the metal gate structure.

In some embodiments, the method further includes annealing the integrated circuit device workpiece to partially oxidize the silicon layer. In some implementations, the conformally depositing of the silicon layer includes depositing the silicon layer using atomic layer deposition (ALD). In some instances, the depositing of the silicon oxide layer includes depositing the silicon oxide layer using spin-on coating.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit device comprising:
   a first multi-gate active region over a substrate;

a second multi-gate active region over the substrate;
an isolation feature disposed over the substrate and between the first multi-gate active region and the second multi-gate active region;
a first gate structure over the first multi-gate active region;
a second gate structure over the second multi-gate active region; and
a dielectric feature disposed over the isolation feature and between the first gate structure and the second gate structure, wherein a top surface of the dielectric feature is coplanar with top surfaces of the first gate structure and the second gate structure, the dielectric feature comprising:
an oxygen-free layer in contact with the first gate structure, the isolation feature and the second gate structure,
a silicon oxide layer over the oxygen-free layer, and
a transition layer disposed between the oxygen-free layer and the silicon oxide layer and between the first gate structure and the second gate structure,
wherein an oxygen content of the transition layer is smaller than an oxygen content of the silicon oxide layer,
wherein the first gate structure and the second gate structure comprise a plurality of metal layers,
wherein the transition layer is spaced apart from the first gate structure, the isolation feature and the second gate structure by the oxygen-free layer.

2. The integrated circuit device of claim 1,
wherein the first and second multi-gate active regions extend in parallel along a first direction,
wherein the first and second gate structures are aligned along a second direction perpendicular to the first direction.

3. The integrated circuit device of claim 1,
wherein the dielectric feature extends into the isolation feature to completely separate the first gate structure and the second gate structure.

4. The integrated circuit device of claim 1, further comprising:
a first source/drain feature over the first multi-gate active region and a second source/drain feature over the second multi-gate active region,
wherein a portion of the dielectric feature extends between the first source/drain feature and the second source/drain feature such that a portion of the transition layer extends between the first source/drain feature and the second source/drain feature.

5. The integrated circuit device of claim 1, wherein the oxygen-free layer comprises silicon nitride.

6. The integrated circuit device of claim 1,
where the transition layer includes a first interface with the oxygen-free layer and a second interface with the silicon oxide layer,
wherein an oxygen content of the first interface is smaller than an oxygen content of the second interface.

7. The integrated circuit device of claim 1, the oxygen-free layer includes a thickness between about 1 nm and about 10 nm.

8. The integrated circuit device of claim 1, the transition layer includes a thickness between about 0.5 nm and about 6 nm.

9. A semiconductor device, comprising:
a first fin structure and a second fin structure;
a first gate structure over the first fin structure;
a second gate structure over the second fin structure; and
a gate cut feature disposed between the first gate structure and the second gate structure, the gate cut feature comprising:
an oxygen blocking layer in contact with the first gate structure and the second gate structure,
an oxygen trap layer over the oxygen blocking layer and disposed between the first gate structure and the second gate structure, and
a silicon oxide layer over the oxygen trap layer and disposed between the first gate structure and the second gate structure,
wherein a dielectric constant of the oxygen blocking layer is greater than a dielectric constant of the silicon oxide layer,
wherein the first gate structure and the second gate structure comprise a plurality of metal layers,
wherein a top surface of the silicon oxide layer is coplanar with top surfaces of the first gate structure and the second gate structure.

10. The semiconductor device of claim 9, wherein the gate cut feature is disposed between and in contact with an end surface of the first gate structure and an end surface of the second gate structure.

11. The semiconductor device of claim 9, wherein the oxygen blocking layer comprises silicon nitride.

12. The semiconductor device of claim 9, wherein the oxygen trap layer comprises silicon.

13. The semiconductor device of claim 9,
wherein the oxygen trap layer comprises a first portion adjacent the silicon oxide layer and a second portion away from the silicon oxide layer,
wherein an oxygen content of the first portion is greater than an oxygen content of the second portion.

14. The semiconductor device of claim 9, wherein a dielectric constant of the oxygen trap layer is greater than a dielectric constant of the oxygen blocking layer.

15. The semiconductor device of claim 9, wherein a thickness of the oxygen trap layer is between about 0.5 nm and about 6 nm.

16. A semiconductor structure, comprising:
a first fin structure extending lengthwise along a first direction;
a second fin structure extending lengthwise along the first direction;
an isolation feature separating the first fin structure and the second fin structure along a second direction perpendicular to the first direction;
a first gate structure over the first fin structure and the isolation feature;
a second gate structure over the second fin structure and the isolation feature; and
a gate cut feature disposed between the first gate structure and the second gate structure,
wherein the gate cut feature extends into the isolation feature,
wherein the first gate structure and the second gate structure comprise a plurality of metal layers,
wherein a top surface of the gate cut feature is coplanar with top surfaces of the first gate structure and the second gate structure,
wherein the gate cut feature comprises:
a silicon nitride layer in contact with the first gate structure and the second gate structure,
a silicon oxide layer over the silicon nitride layer and disposed between the first gate structure and the second gate structure, and an oxygen trap layer separating the silicon nitride layer and the silicon oxide layer.

17. The semiconductor structure of claim 16, wherein the first fin structure is disposed over a first well region in a substrate,
wherein the second fin structure is disposed over a second well region in a substrate.

18. The semiconductor structure of claim 16, wherein the first gate structure is aligned with the second gate structure along the second direction.

19. The semiconductor structure of claim 16, wherein the oxygen trap layer comprises silicon.

20. The semiconductor structure of claim 16,
wherein a thickness of the oxygen trap layer is between about 0.5 nm and about 6 nm,
wherein a thickness of the silicon nitride layer is between about 1 nm and about 10 nm.

* * * * *